United States Patent
Okumura

(10) Patent No.: US 9,577,136 B2
(45) Date of Patent: Feb. 21, 2017

(54) SEMICONDUCTOR LIGHT-RECEIVING ELEMENT AND METHOD FOR MANUFACTURING SAME

(71) Applicant: FUJITSU LIMITED, Kawasaki-shi, Kanagawa (JP)

(72) Inventor: Shigekazu Okumura, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/180,198

(22) Filed: Jun. 13, 2016

(65) Prior Publication Data

US 2016/0293788 A1 Oct. 6, 2016

Related U.S. Application Data

(60) Division of application No. 14/885,056, filed on Oct. 16, 2015, now Pat. No. 9,401,447, and a continuation
(Continued)

(51) Int. Cl.
| | |
|---|---|
| *H01L 31/105* | (2006.01) |
| *G02B 6/122* | (2006.01) |
| *H01L 31/0232* | (2014.01) |
| *H01L 31/028* | (2006.01) |
| *H01L 31/0352* | (2006.01) |

(Continued)

(52) U.S. Cl.
CPC .......... *H01L 31/105* (2013.01); *G02B 6/1228* (2013.01); *H01L 31/028* (2013.01); *H01L 31/02327* (2013.01); *H01L 31/035281* (2013.01); *H01L 31/109* (2013.01); *H01L 31/1804* (2013.01); *H01L 31/1808* (2013.01); *H01L 31/1864* (2013.01); *H04J 14/02* (2013.01)

(58) Field of Classification Search
CPC ............ H01L 31/105; H01L 31/02327; H01L 31/028; H01L 31/035281; H01L 31/109; H01L 31/1804; H01L 31/1808; H01L 31/1864; G02B 6/1228; H04J 14/02
See application file for complete search history.

(56) References Cited

U.S. PATENT DOCUMENTS

| | | |
|---|---|---|
| 4,868,838 A | 9/1989 | Yamamoto |
| 7,418,166 B1 | 8/2008 | Kapur |
| (Continued) | | |

FOREIGN PATENT DOCUMENTS

| | | |
|---|---|---|
| JP | 2002-151730 | 5/2002 |
| WO | 2008080428 | 7/2008 |

OTHER PUBLICATIONS

Yasuhiko Ishikawa, et al., "Strain-induced enhancement of near-infrared absorption in Ge epitaxial layers grown on Si substrate", Journal of Applied Physics 98, 013501 (2005) (10 pages).
(Continued)

*Primary Examiner* — Jarrett Stark
(74) *Attorney, Agent, or Firm* — Fujitsu Patent Center

(57) ABSTRACT

The present invention pertains to a semiconductor light-receiving element and a method for manufacturing the same, enabling operation in a wide wavelength bandwidth and achieving fast response and high response efficiency. A PIN type photodiode made by sequentially layering on top of the substrate a Si layer of a first conductivity type, a non-doped Ge layer and a Ge layer of a second conductivity type that is the opposite type of the first conductivity type and a Ge current-blocking mechanism is provided in at least part of the periphery of the PIN type photodiode.

4 Claims, 20 Drawing Sheets

Related U.S. Application Data of application No. PCT/JP2013/061625, filed on Apr. 19, 2013.

(51) Int. Cl.
  *H01L 31/109* (2006.01)
  *H01L 31/18* (2006.01)
  *H04J 14/02* (2006.01)

(56) References Cited

U.S. PATENT DOCUMENTS

| | | |
|---|---|---|
| 2002/0056845 A1 | 5/2002 | Iguchi et al. |
| 2007/0104441 A1 | 5/2007 | Ahn et al. |
| 2007/0284688 A1 | 12/2007 | Lagally |
| 2008/0272391 A1 | 11/2008 | Kapur |
| 2009/0181515 A1 | 7/2009 | Herner |
| 2013/0065349 A1 | 3/2013 | Assefa et al. |
| 2013/0119505 A1 | 5/2013 | Harame |
| 2015/0171259 A1 | 6/2015 | Hartmann |

OTHER PUBLICATIONS

Tao Yin et al., "31GHz Ge n-i-p waveguide photodetectors on Silicon-on-Insulator substrate", Oct. 17, 2007 / vol. 15, No. 21, Optics Express, pp. 13965-13971 (7 pages).

L. Ding et al., "Ge Waveguide Photodetectors with Responsivity Roll-off beyond 1620 nm Using Localized Stressor", OFC/NFOEC Technical Digest, OW3G.4, Jan. 23, 2012 (3 pages).

International Search Report and Written Opinion of the International Searching Authority (Form PCTIISAI210, Form PCT/ISA/237), mailed in connection with PCT/JP2013/061625 and mailed May 28, 2013, with Partial English Translation (7 pages).

EESR—Extended European Search Report of European Patent Application No. 13882362.0 dated Apr. 22, 2016.

Tao Yin et al., "31GHz n-i-p Waveguide Photodetectors on Silicon-on-Insulator Substrate", Optics Express, vol. 15, No. 21, Oct. 17, 2007, pp. 13965-13971, XP055233061.

L. Ding et al., "Ge Waveguide Photodetectors with Responsivity Roll-off Beyond 1620 nm Using Localized Stressor", Optical Fiber Communication Conference and Exposition (OFC/NFOEC), and the National Fiber Optic Engineers Conference, IEEE, Mar. 4, 2012, pp. 1-3, XP032340068, ISBN:978-1-4673-0262-3.

USPTO, (STARK) Notice of Allowance and Notice of Allowability, May 6, 2016, in parent U.S. Appl. No. 14/885,056 [pending].

USPTO, (STARK) Restriction Requirement, Feb. 18, 2016, in parent U.S. Appl. No. 14/885,056 [pending].

SEMICONDUCTOR LIGHT-RECEIVING ELEMENT AND METHOD FOR MANUFACTURING SAME

CROSS-REFERENCE TO RELATED APPLICATION

This application is a divisional of application Ser. No. 14/885,056, filed Oct. 16, 2015, which is a continuation application of International Application PCT/JP2013/061625 filed on Apr. 19, 2013 and designated the U.S., the entire contents of which are incorporated herein by reference.

FIELD

The present invention relates to a semiconductor light-receiving element and a method for manufacturing the same, and in particular, to a semiconductor light-receiving element of which the light absorbing layer is made of Ge provided on a Si substrate to be used for optical communication and data communication as well as a method for manufacturing the same.

BACKGROUND

As data transmission amounts between server and CPUs have increased in recent years, the handling of data through transmission of electrical signals using conventional Cu wires are approaching the limit. In order to resolve this bottleneck, optical interconnection, that is to say, data transmission through optical signals is required. Furthermore, from the points of view of reduction in power consumption and reduction in the area of devices, elements formed by integrating optical components such as optical transmitters, optical modulators and optical receivers that are required for optical transmission/reception on a Si substrate become necessary.

Meanwhile, optical components integrated on a Si substrate are connected through optical fibers and, therefore, it is preferable to use the wavelength of 1.55 µm, with which loss is low in optical fibers, as a transmission wavelength band. Therefore, it is preferable to use Ge, which has an absorption end in the vicinity of 1.55 µm, as an absorbing layer of a photodetector to be used for optical transmission with a band of the wavelength of 1.55 µm.

Meanwhile, wavelength division multiplexing (WDM) transmission is required as the data transmission amount increases. In order to implement WDM transmission, Ge photodetectors having a high response sensitivity in a broad region of which the wavelengths are longer than 1.55 µm are necessary.

In general, when the temperature is cooled to room temperature while Ge is growing on a Si substrate, the Ge epitaxial layer is subject to tensile strain in the directions within the plane of the substrate due to the difference between the coefficients of thermal expansion of Si and Ge. As a result, the absorption end of Ge on the Si substrate has a longer wavelength as compared to Ge layers in a bulk state, as has been reported (see Non-Patent Literature 1). This works advantageously from the point of view of expansion of the wavelength band of the photodetectors.

Meanwhile, the element capacitance of photodetectors is required to be lowered from the point of view of increase in the high-speed response properties and, thus, it is necessary to make the element area smaller (make the element width narrower). In addition, from the point of view of increase in the response sensitivity properties, it is required to prevent photocarriers generated in the depletion layer from recombining or becoming trapped by lattice defects while drifting. In order to do so, it is likewise necessary to make the element area smaller (make the element width narrower).

Thus, it has been reported that a photodetector having Ge on a Si substrate as an absorbing layer is processed as a mesa element having a width of approximately of several µm (see Non-Patent Literature 2). FIG. 20 is a schematic cross sectional diagram illustrating a conventional photodetector having Ge as an absorbing layer where the photodetector is formed using an SOI substrate. A Si layer 83 provided on top of a Si substrate 81 with a BOX layer 82 in between is processed to form a p type Si mesa portion 84 and p type Si slab portions 85 on the two sides thereof. At this time, a waveguide in stripe form is formed so as to be connected to the p type Si mesa portion 84 through a tapered portion, though this is not shown.

A non-doped Ge layer is formed on top of this p type Si mesa portion 84 through selective growth and n type impurities are implanted into the surface thereof so as to provide an $n^{++}$ type Ge contact layer 87, where the portion into which the impurities have not been introduced is an i type Ge light absorbing layer 86. Meanwhile, p type impurities are implanted into portions of the p type Si slab portions 85 so as to form $p^{++}$ type Si contact portions 88.

Next, an oxide film 89 that becomes the upper clad layer of the waveguide in stripe form is formed, plugs 90 and 91 are formed and, then, an n side electrode 92 and p side electrodes 93 are formed. Light that propagates through the waveguide in stripe form passes through the p type Si mesa portion so as to reach, and be absorbed by, the i type Ge light absorbing layer 86 through evanescent coupling.

CITATION LIST

Non-Patent Literature

Non-Patent Literature 1: Yasuhiko Ishikawa, Kazumi Wada, Jifeng Liu, Douglas D. Cannon, Hsin-Chiao Luan, Jurgen Michel, and Loinel C. Kimerling, Journal Of Applied Physics 98, 013501 (2005)

Non-Patent Literature 2: Tao Yin, Rami Cohen, Mike M. Morse, Gadi Sarid, Yoel Chetrit, Doron Rubin, and Mario J. Paniccia, Optics Express, 15, 13966 (2007)

Non-Patent Literature 3: L. Ding, T. Y. Liow, A. E. J. Lim, N. Duan, M. B. Yu, and G. Q. Lo, OFC/NFOEC Technical Digest, OW3G. 4 (2012)

SUMMARY

It has been reported that, as the width of the element becomes narrower, lattice relaxation progresses within the plane and the tensile strain induced in the Ge layer is reduced (see Non-Patent Literature 3). As a result, the absorption end of Ge has shorter wavelengths, which lowers the response sensitivity on the long wavelength side when the width of the element is made narrower in order to lower the element capacitance or to reduce the loss of photocarriers.

Meanwhile, the element capacitance increases, which leads to the deterioration of the high-speed properties, and the loss of photocarriers increases, which leads to the deterioration of the response efficiency, when the width of the element is made wider in order to suppress the reduction in the tensile strain within the plane for the purpose of increase in the response efficiency with a long wavelength. That is to say, such a problem arises with the photodetector having the structure illustrated in FIG. 20 that expansion of the width of the wavelength band through the induction of tensile strain and increase in the high-speed response properties and the response efficiency through miniaturization cannot both be achieved at the same time.

According to one disclosed aspect, a semiconductor light-receiving element includes: a substrate of which a surface is a single crystal Si layer; a PIN type photodiode made by sequentially layering on top of the substrate a Si layer of a first conductivity type, a non-doped Ge layer and a Ge layer of a second conductivity type that is the opposite type of the first conductivity type; a Ge current blocking mechanism provided in at least a portion in the periphery of the layer structure made of the non-doped Ge layer and the Ge layer of the second conductivity type; a contact electrode for the second conductivity type provided on the Ge layer of the second conductivity type; and a contact electrode for the first conductivity type provided in the Si layer of the first conductivity type.

According to another disclosed aspect, a method for manufacturing a semiconductor light-receiving element includes : implanting impurity ions of a first conductivity type into at least a portion of a surface of a substrate of which the surface is a single crystal Si layer and annealing the impurity ions for activation; growing a non-doped Ge layer on at least a Si region of the first conductivity type into which impurity ions of the first conductivity type have been implanted; forming, on a surface of the non-doped Ge layer, a first dielectric mask that covers a region on which a photodiode is to be formed; implanting impurity ions of a second conductivity type that is the opposite conductivity type of the first conductivity type into an exposed portion of the non-doped Ge layer using the first dialectic mask as a mask; compensating the surface with impurities of the first conductivity type by implanting the impurities of the first conductivity type into the exposed portion of the non-doped Ge layer at a location that is shallower than the impurities of the second conductivity type using the first dielectric mask as a mask; forming a second dielectric mask from which only the region on which a photodiode is to be formed is exposed; implanting impurities of the second conductivity type into an exposed surface of the non-doped Ge layer using the second dielectric mask as a mask; and annealing the implanted impurities for activation.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
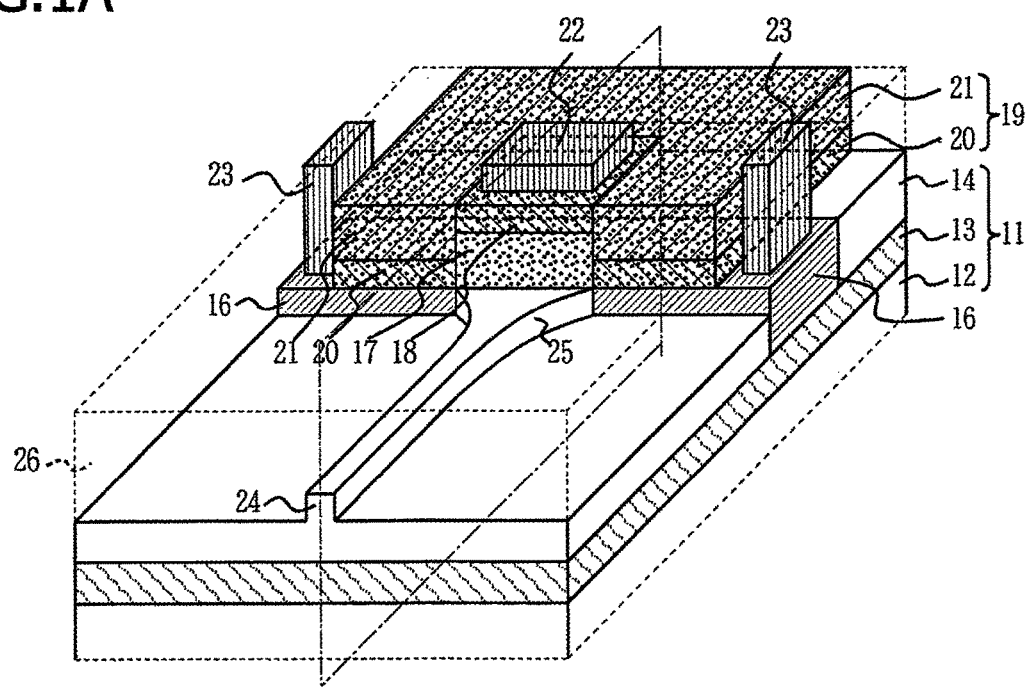
FIGS. 1A and 1B are a perspective diagram and a cross sectional diagram illustrating the semiconductor light-receiving element according to the present invention.
Figure 1B:
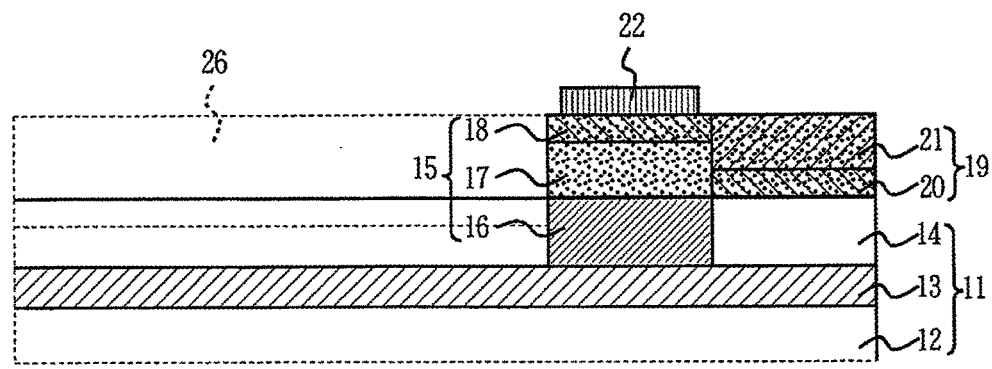
Figure 2A:
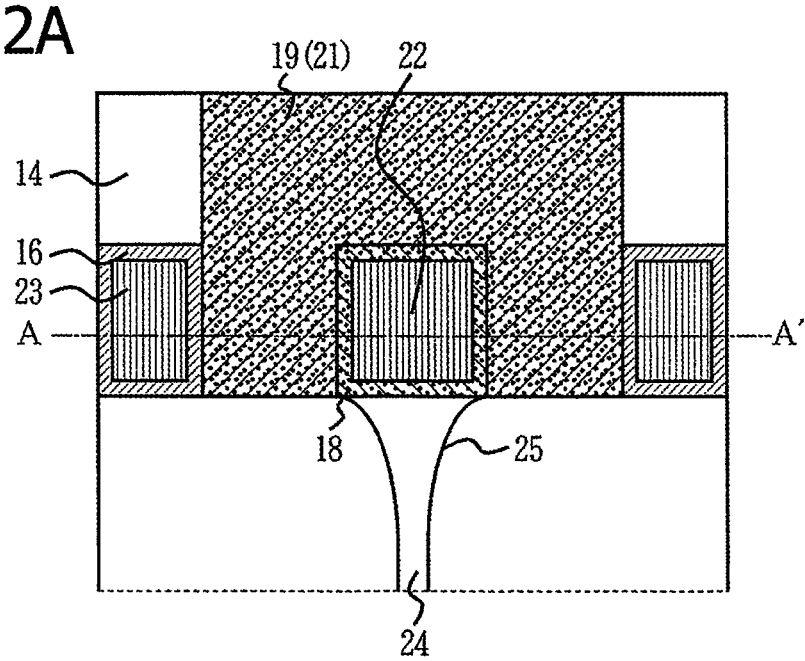
FIGS. 2A and 2B are a top diagram and a cross sectional diagram illustrating the semiconductor light-receiving element according to the present invention.
Figure 2B:
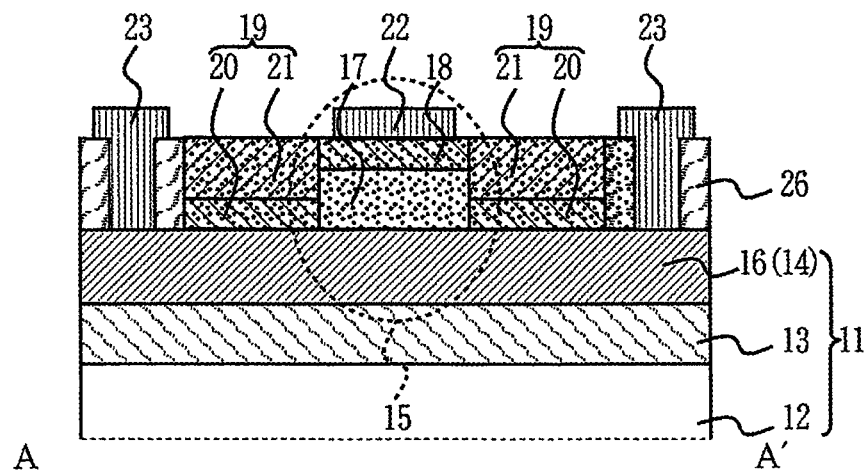

Here, the semiconductor light-receiving element according to an embodiment of the present invention is described in reference to FIGS. 1A through 2B. FIGS. 1A and 1B are a perspective diagram and a cross sectional diagram illustrating the semiconductor light-receiving element according to the present invention. FIGS. 2A and 2B are a top diagram and a cross sectional diagram illustrating the semiconductor light-receiving element according to the present invention. A PIN type photodiode 15 is formed on a substrate 11 of which the surface is a single crystal Si layer 14 by sequentially layering a Si layer 16 of the first conductivity type, a non-doped Ge layer 17 and a Ge layer of the second conductivity type 18.

A Ge current blocking mechanism 19 is provided in at least a portion in the periphery of the multi-layered structure made of the non-doped Ge layer 17 and the Ge layer 18 of the second conductivity type, and a contact electrode 22 for the second conductivity type is provided on top of the Ge layer 18 of the second conductivity type. Meanwhile, a contact electrode 23 for the first conductivity type is provided so as to be connected to the Si layer 16 of the first conductivity type.

This Ge current blocking mechanism 19 typically has a structure where a Ge layer 20 of the second conductivity type and a Ge layer 21 of the first conductivity type are layered on top of each other starting from the substrate 11 side. As a result, a thyristor structure made of the Ge layer 18 of the second conductivity type, the Ge layer 21 of the first conductivity type, the Ge layer 20 of the second conductivity type and the Si layer 16 of the first conductivity type is formed between the contact electrode 22 for the second conductivity type and the contact electrode 23 for the first conductivity type.

When the thyristor structure is formed, a current does not flow through the thyristor structure in the backward direction when backward biased to the breakdown voltage or lower in the backward direction. Accordingly, the thyristor structure functions as a carrier blocking area which prevents photocarriers generated in the non-doped Ge layer 17 from dispersing into the periphery. As a result, the carrier path is narrowed and the element capacitance is lowered. At the same time, it is possible to reduce the number of photocarriers that recombine or are trapped by lattice defects within the depletion layer due to drifting.

The PIN type photodiode 15 typically has a rectangular parallelepiped form of which three sides out of the four sides may make contact with the Ge current blocking mechanism 19. In this case, on the one side that does not make contact with the Ge current blocking mechanism 19, a single crystal Si core layer 24 in stripe form may be connected to the Si layer 16 of the first conductivity type via a tapered waveguide 25.

Thus, the PIN type photodiode 15 is surrounded by the Ge current blocking mechanism 19 made of Ge so that the strain relaxation induced in the periphery of the non-doped Ge layer 17 does not transfer to the non-doped Ge layer 17. Therefore, wavelengths are not shortened at the absorbing end of the non-doped Ge layer 17 due to the reduction in the tensile strain.

Alternatively, all of the sides of the PIN type photodiode 15 may be surrounded by the Ge current blocking mechanism 19 and, in this case, the top surface of the PIN type photodiode 15 may be a surface through which light enters. In addition, the substrate 11 may be a single crystal Si substrate, but typically an SOI substrate where a single crystal Si layer 14 is provided on a crystal Si substrate 12 with a $SiO_2$ film 13 in between is used.

In the case where such a semiconductor light-receiving element is formed, impurity ions of the first conductivity type are implanted into at least a portion of the surface of a substrate 11 of which the surface is a single crystal Si layer 14 and are activated through annealing, and a non-doped Ge layer 17 is grown on the region of the Si layer 16 of the first conductivity type into which impurity ions of the first conductivity type have been implanted. Next, a first dielectric mask that covers the region on which a photodiode is to be formed is formed on the surface of the non-doped Ge layer 17. The first dielectric mask is used as a mask to implant impurity ions of the second conductivity type into the exposed portion of the non-doped Ge layer 17 so that a Ge layer 20 of the second conductivity type is formed.

Next, impurities of the first conductivity type are implanted into the exposed portion of the non-doped Ge layer 17 into which impurities of the second conductivity type have been implanted using the first dielectric mask as a mask at a location shallower than the implanted impurities of the second conductivity type so that the surface is compensated with impurities of the first conductivity type and, thus, a Ge layer 21 of the first conductivity type is formed. Next, a second dielectric mask is formed for exposing only the region on which a photodiode is to be formed. This second dielectric mask may be used as a mask so that impurities of the second conductivity type can be implanted into the surface of the exposed non-doped Ge layer 17 so as to form a Ge layer 18 of the second conductivity type.

Here, the single crystal Si layer 14 may be etched so that a tapered waveguide 25 to be connected to the photodiode region and a single crystal Si core layer 24 in stripe form to be connected to the tapered waveguide 25 can be formed.

In addition, in the step of growing the non-doped Ge layer 17, it is desirable to use a two-stage growth step including a first growth step for growing a layer at a relatively low temperature in order to form a flat layer through secondary growth and a second growth step for growing a layer at a relatively high temperature in order to make possible the growth of a high quality crystal. Here, typical examples of the method for growing the non-doped Ge layer 17 are low pressure chemical vapor deposition methods and molecular beam epitaxial growth methods.

In the embodiment of the present invention a Ge layer is provided around the non-doped Ge layer 17 that becomes the light absorbing layer and, therefore, strain relaxation is suppressed and the wavelength can be prevented from becoming shorter at the absorbing end of the non-doped Ge layer 17. At the same time, it is possible to reduce the element capacitance and to reduce the number of photocarriers that are trapped by lattice defects. As a result, it is possible to realize operation with a broad wavelength band, and a rapid high-speed response and a high response efficiency at the same time.

Example 1

Figure 3A:
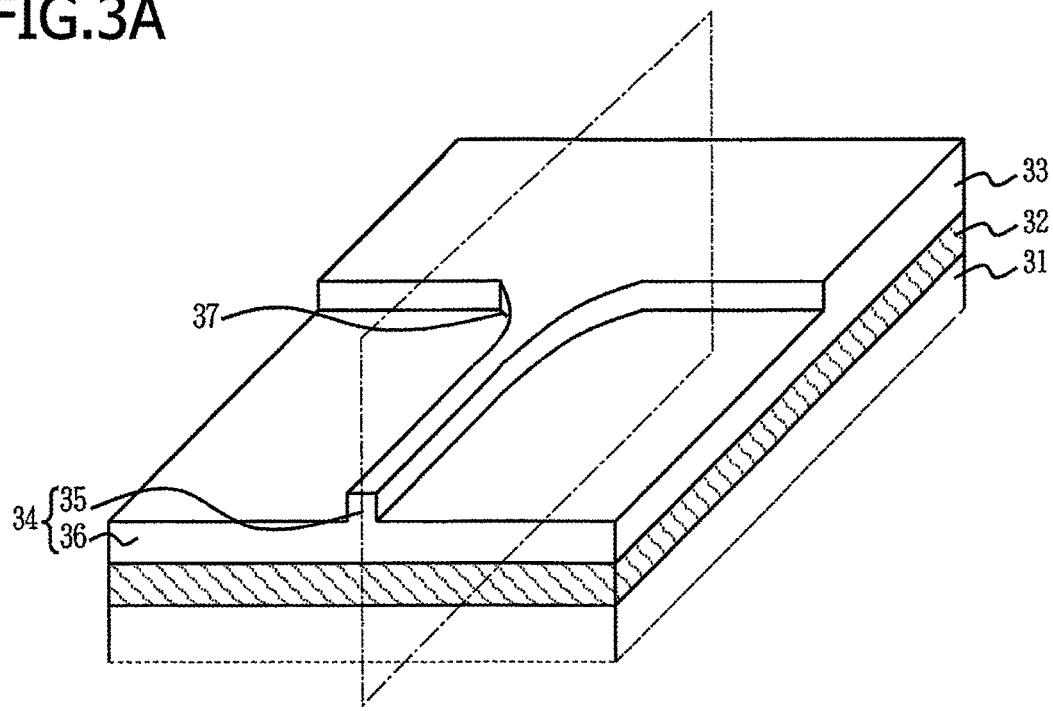
FIGS. 3A and 3B are diagrams illustrating the semiconductor light-receiving element according to Example 1 of the present invention in a step during the manufacturing process.
Figure 3B:
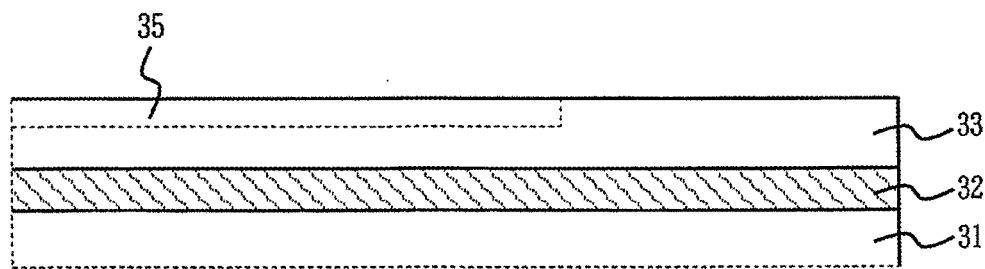

Next, a process for manufacturing the semiconductor light-receiving element according to Example 1 of the present invention is described in reference to FIGS. 3A through 10B. Here, FIGS. 3A, 4A, 5A, 6A, 7A, 8A and 9A are schematic perspective diagrams and FIGS. 3B, 4B, 5B, 6B, 7B, 8B and 9B are cross-sectional diagrams along the parallelogram depicted by the single-dotted chain line. First, as illustrated in FIGS. 3A and 3B, an SOI substrate is prepared where a single crystal i type Si layer 33 having a thickness of 0.3 μm is provided on a Si substrate 31 of which the main surface is (001) with a BOX layer 32 having a thickness of 3.0 μm in between.

Next, a resist is applied onto the i type Si layer 33 and patterned into the form of a Si passive waveguide through exposure to light using electron beam lithography, which is followed by development through wet etching. Next, a Si rib type waveguide 34 having a core layer 35 and a slab portion 36 is formed through inductively coupled plasma (ICP) dry etching. Here, a tapered portion 37 is provided on the side that makes contact with the i type Si layer 33.

Figure 4A:
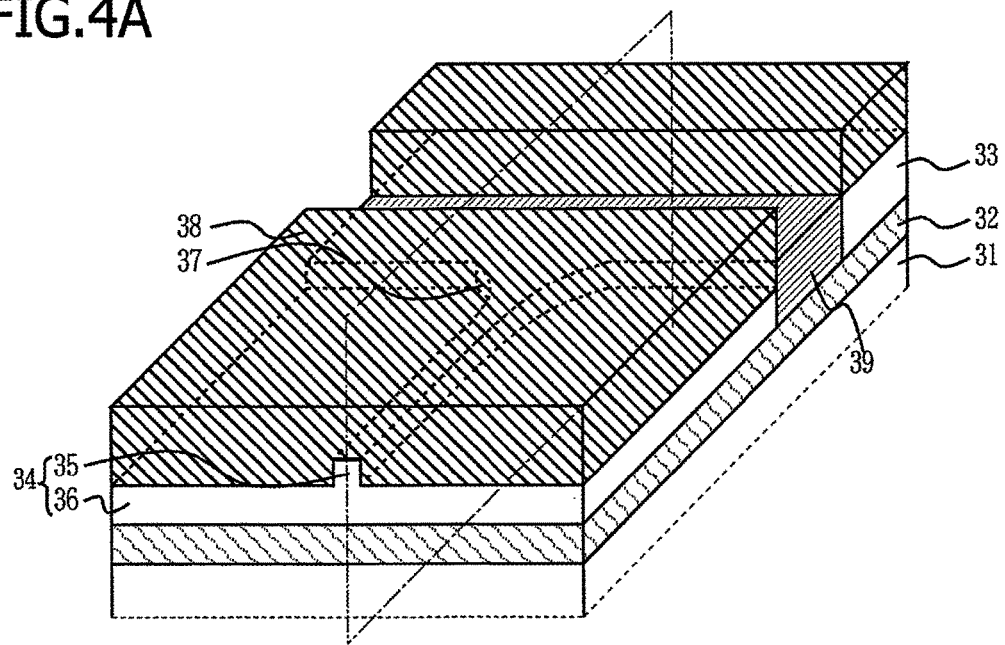
FIGS. 4A and 4B are diagrams illustrating the semiconductor light-receiving element according to Example 1 of the present invention in a step following the step in FIGS. 3A and 3B during the manufacturing process.
Figure 4B:
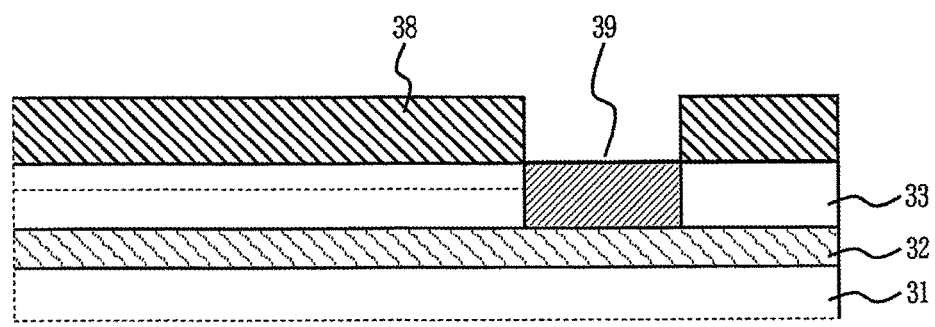

Next, as illustrated in FIGS. 4A and 4B a $SiO_2$ film is deposited on the entire surface in accordance with a CVD method and is patterned to form a mask 38 for ion implantation, which has openings only for regions of a light-receiving portion and a thyristor portion. Next, B ions are implanted using the mask 38 for ion implantation as a mask. In this case, the implantation energy is 40 keV and the dosage amount is $5.0 \times 10^{14}$ $cm^{-2}$. Next, an annealing process for activating the implanted B ions is carried out for one second at 1050° C. so as to form a p type Si layer 39. The concentration of impurities in the p type Si layer 39 is $1.0 \times 10^{18}$ $cm^{-3}$ to $3.0 \times 10^{19}$ $cm^{-3}$.

Figure 5A:
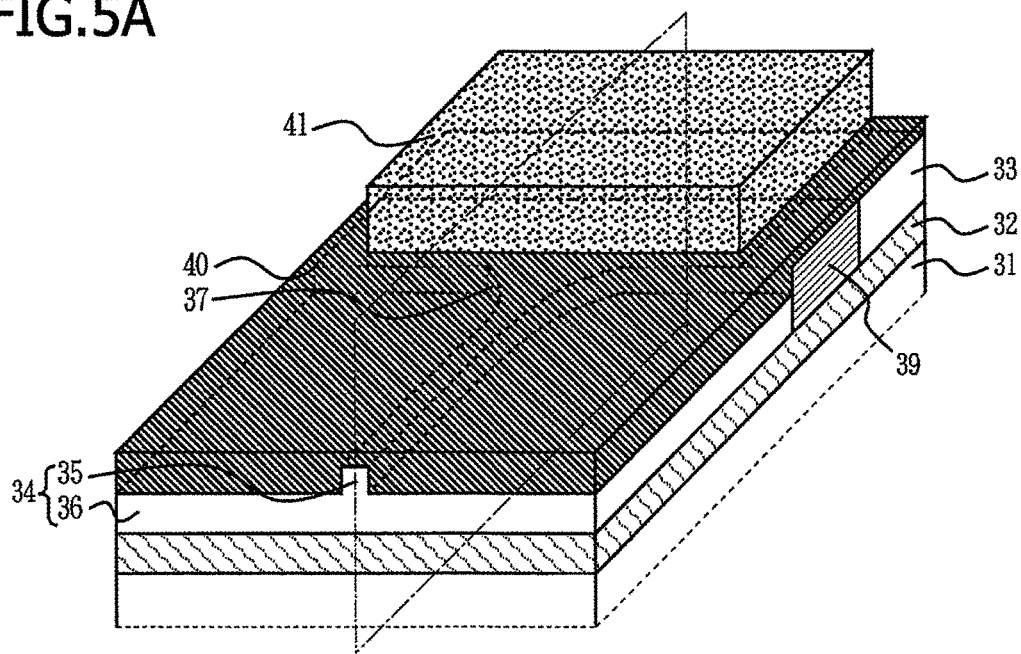
FIGS. 5A and 5B are diagrams illustrating the semiconductor light-receiving element according to Example 1 of the present invention in a step following the step in FIGS. 4A and 4B during the manufacturing process.
Figure 5B:
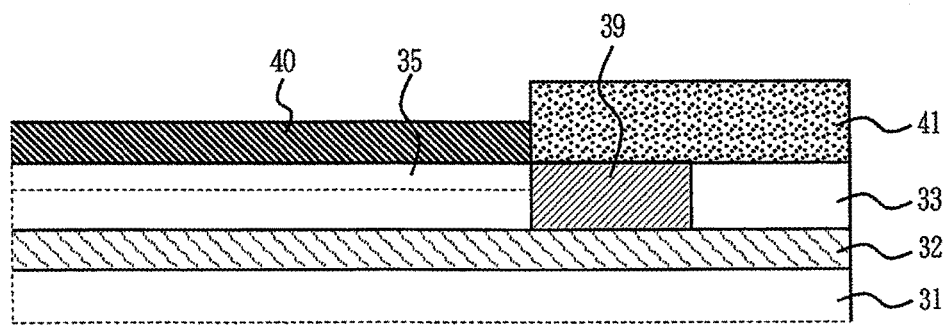

Next, as illustrated in FIGS. 5A and 5B, a mask 40 for selective growth made of a $SiO_2$ film is provided and an i type Ge layer 41, having a thickness of 0.8 μm is selectively grown in accordance with a low pressure CVD method. In this case, $GeH_4$ is used as a material gas and $H_2$ is used as a carrier gas. The layer is first grown by 0.1 μm at a low temperature of 400° C. and then the layer is grown by 0.7 μm at a high temperature of 700° C.

Figure 6A:
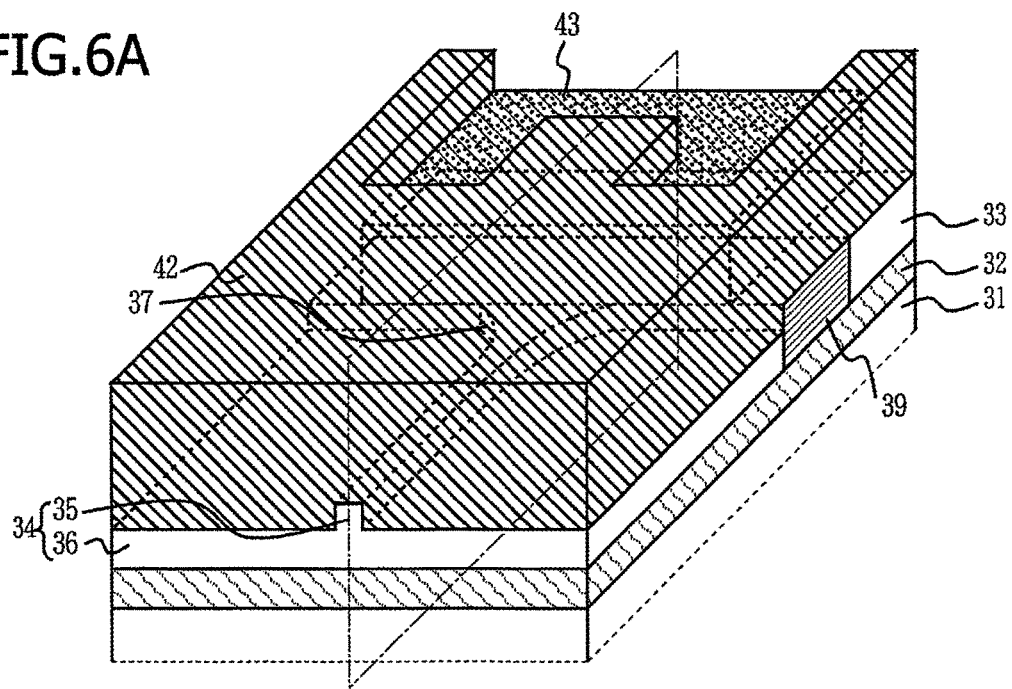
FIGS. 6A and 6B are diagrams illustrating the semiconductor light-receiving element according to Example 1 of the present invention in a step following the step in FIGS. 5A and 5B during the manufacturing process.
Figure 6B:
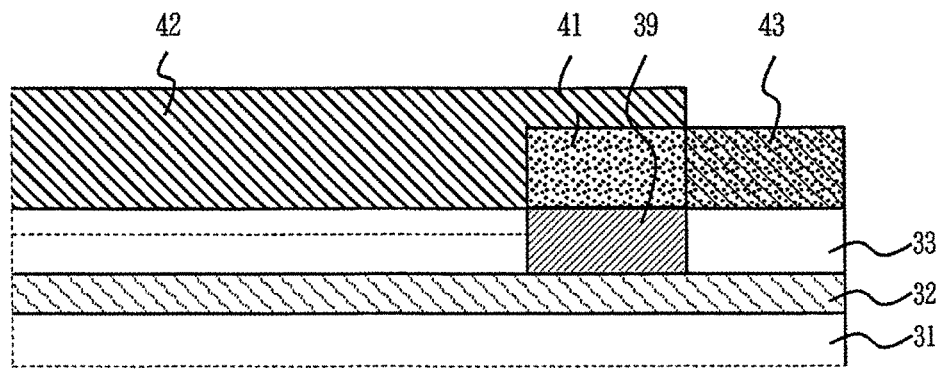

Next, as illustrated in FIGS. 6A and 6B, a mask 42 for ion implantation having an opening only for a portion in which a thyristor structure is to be formed is made of a $SiO_2$ film. Next, this mask 42 for ion implantation is used as a mask to implant P ions so that the entirety of the i type Ge layer 41 is doped. In this case, the implantation energy is 600 keV and the dosage amount is $1.0 \times 10^{14}$ $cm^{-2}$. As a result, the concentration of impurities in the n type Ge layer 43 is $1.0 \times 10^{18}$ $cm^{-3}$ to $2.0 \times 10^{18}$ $cm^{-3}$.

Figure 7A:
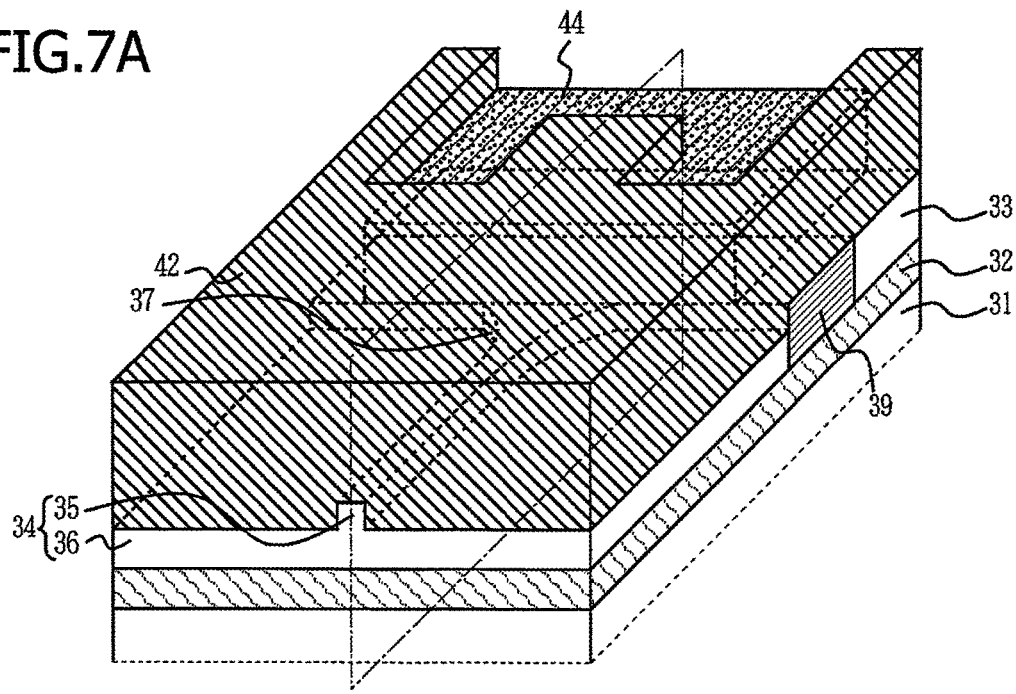
FIGS. 7A and 7B are diagrams illustrating the semiconductor light-receiving element according to Example 1 of the present invention in a step following the step in FIGS. 6A and 6B during the manufacturing process.
Figure 7B:
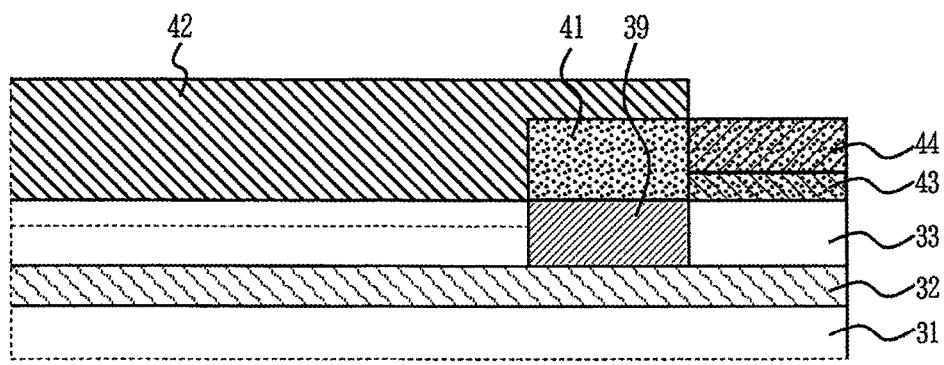

Next, as illustrated in FIGS. 7A and 7B, the same mask 42 for ion implantation is used as a mask to shallowly implant B ions so that the upper layer, having a thickness of 0.5 μm, is compensated and becomes a p type Ge layer 44 while the bottom layer, having a thickness of 0.3 μm, is not compensated and remains as an n type Ge layer 43. In this case, the implantation energy is 100 keV and the dosage amount is $3.0 \times 10^{14}$ $cm^{-2}$. As a result, the concentration of impurities in the p type Ge layer 44 is $1.0 \times 10^{18}$ $cm^{-3}$ to $1.0 \times 10^{19}$ $cm^{-3}$.

Figure 8A:
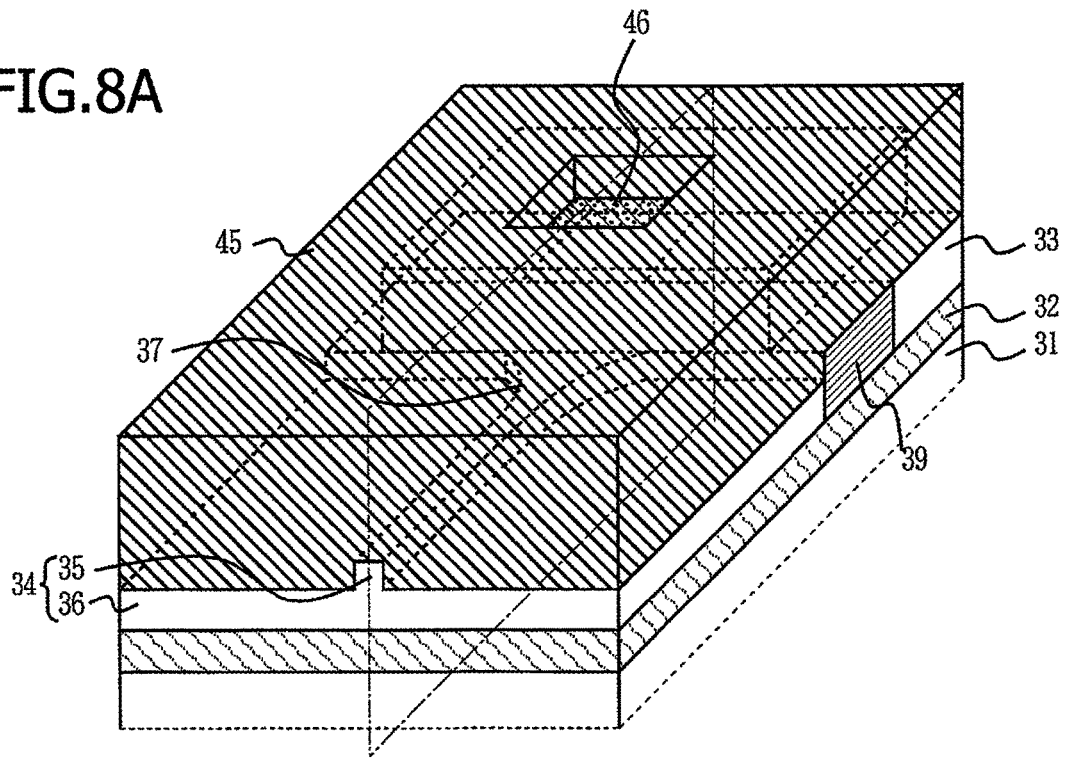
FIGS. 8A and 8B are diagrams illustrating the semiconductor light-receiving element according to Example 1 of the present invention in a step following the step in FIGS. 7A and 7B during the manufacturing process.
Figure 8B:
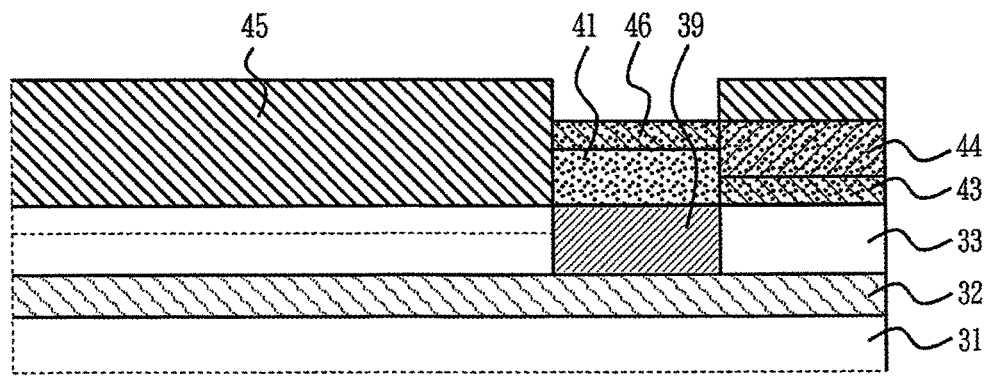

Next, as illustrated in FIGS. 8A and 8B, the mask 42 for ion implantation is removed with hydrofluoric acid, and after that a new mask 45 for ion implantation having an opening only for the region in which a photodiode is to be formed is made of a $SiO_2$ film. The mask 45 for ion implantation is used as a mask to implant P ions so that the upper layer, having a thickness of 0.3 μm, is converted to an n type Ge layer 46. In this case, the implantation energy is 40 keV and the dosage amount is $1.0 \times 10^{14}$ $cm^{-2}$. As a result, the concentration of impurities in the n type Ge layer 46 is $4.0 \times 10^{18}$ $cm^{-3}$ to $1.0 \times 10^{19}$ $cm^{-3}$, and the concentration of impurities located at a depth of 0.3 μm from the surface is $1.0 \times 10^{16}$ $cm^{-3}$.

Figure 9A:
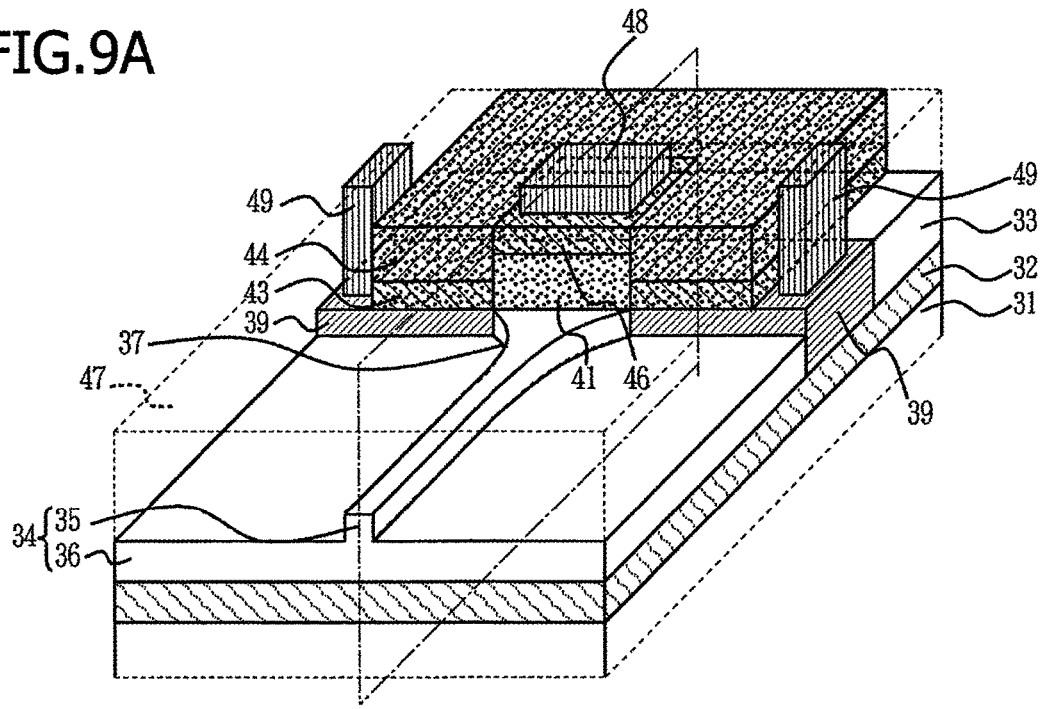
FIGS. 9A and 9B are diagrams illustrating the semiconductor light-receiving element according to Example 1 of the present invention in a step following the step in FIGS. 8A and 8B during the manufacturing process.
Figure 9B:
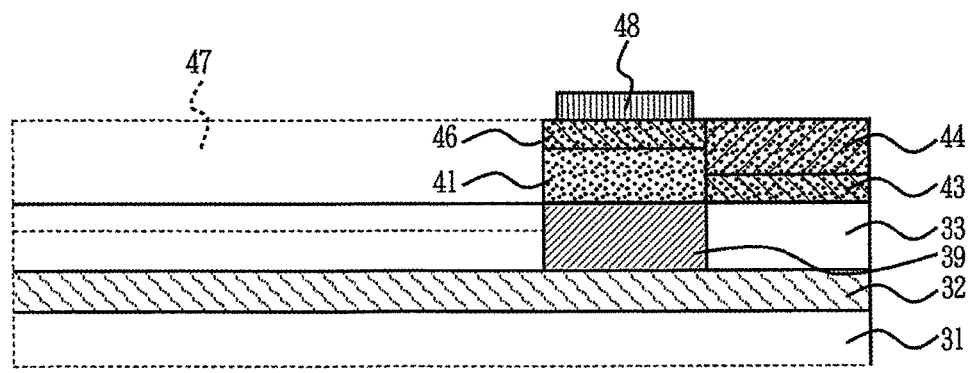

Next, as illustrated in FIGS. 9A and 9B, the mask 45 for ion implantation is removed with hydrofluoric acid, and after that annealing for activation is carried out for one second at 1050° C. so as to activate the implanted impurities. Next, a $SiO_2$ film, which becomes an upper clad layer 47 and also becomes a passivation film in the element portion, is deposited in accordance with a low pressure CVD method, and after that the surface of the $SiO_2$ film and the Ge layer is flattened in accordance with a chemical mechanical polishing (CMP) method.

Next, while not shown in the figures, a resist is applied onto the flattened surface and is patterned to the form of contact holes through exposure to light using electron beam lithography, which is followed by development through wet etching. Next, contact holes are created through ICP dry etching and wet etching with HF.

Next, a TiN film, which becomes a barrier metal, is formed in accordance with a spattering method, and after that the contact holes are filled in with Al. Next, the resist used for the creation of contact holes is removed and at the same time the Al layer that has been deposited on the resist is lifted off so as to form an n side electrode 48 and a p side electrode 49. Thus, the basic structure of the semiconductor light-receiving element according to Example 1 of the present invention is complete.

Figure 10A:
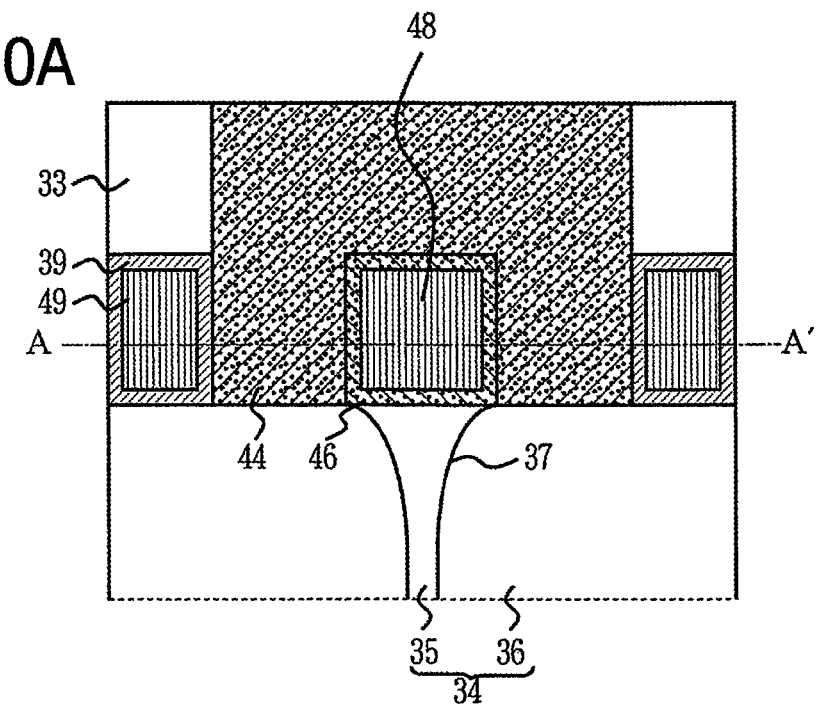
FIGS. 10A and 10B are diagrams illustrating the structure of the semiconductor light-receiving element according to Example 1 of the present invention.
Figure 10B:
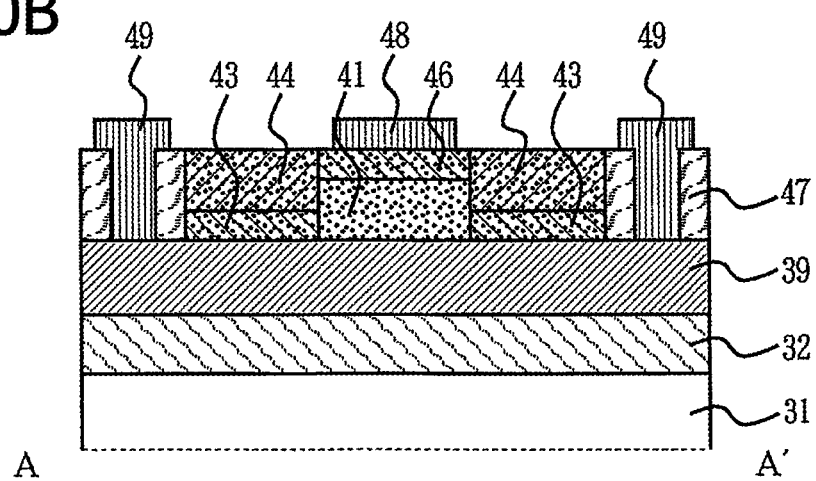

FIGS. 10A and 10B are diagrams illustrating the structure of the semiconductor light-receiving element according to Example 1 of the present invention. FIG. 10A is a top diagram and FIG. 10B is a cross-sectional diagram along the single-dotted chain line A-A' in FIG. 10A. As illustrated in the figures, the three sides of the PIN type photodiode made of the n type Ge layer 46, the i type Ge layer 41 and the p type Si layer 39 are surrounded by the p type Ge layer 44 and the n type Ge layer 43, and therefore strain relaxation on the three end surfaces can be prevented from affecting the PIN type photodiode. In addition, a thyristor structure made of the n type Ge layer 46, the p type Ge layer 44, the n type Ge layer 43 and the p type Si layer 39 is formed on the two sides of the PIN type photodiode so as to function as a current blocking layer, which makes it possible to reduce a leak current. Here, a pseudo thyristor-like current block mechanism is formed of the n type Ge layer 46, the p type Ge layer 44, the n type Ge layer 43, the i type Si layer 33 and the p type Si layer 39 on the side opposite to the surface through which light enters.

Signal light that has entered into the core layer 35 propagates through the tapered portion 37 and reaches the p type Si layer 39 so as to be transmitted to the i type Ge layer 41 through evanescent coupling, and then is extracted from the n side electrode 48 as an electrical signal. Here, the p side electrode 49 is usually set to the ground potential.

Example 2

Figure 11A:
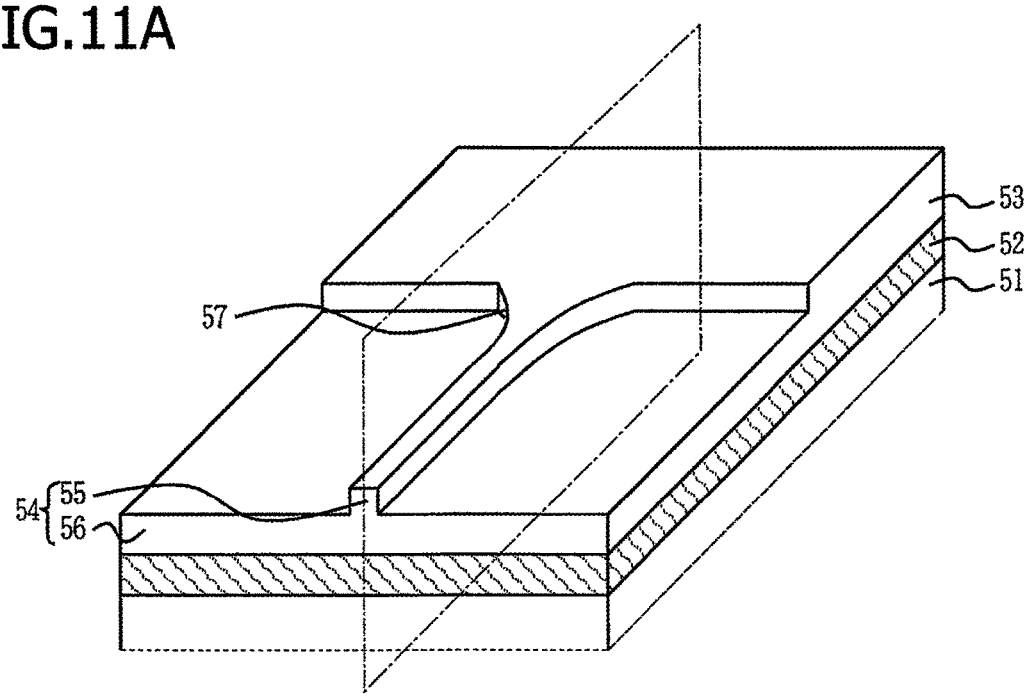
FIGS. 11A and 11B are diagrams illustrating the semiconductor light-receiving element according to Example 2 of the present invention in a step during the manufacturing process.
Figure 11B:
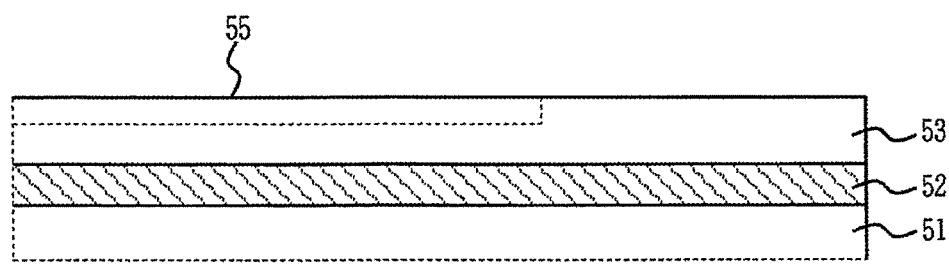

Next, a process for manufacturing the semiconductor light-receiving element according to Example 2 of the present invention is described in reference to FIGS. 11A through 18B. The basic process is the same as the above description for Example 1 except that the conductivity types are opposite. Here, FIGS. 11A, 12A, 13A, 14A, 15A, 16A and 17A are schematic perspective diagrams and FIGS. 11B, 12B, 13B, 14B, 15B, 16B and 17B are cross-sectional diagrams along the parallelogram depicted by the single-dotted chain line. First, as illustrated in FIGS. 11A and 11B, an SOI substrate is prepared where a single crystal i type Si layer 53 having a thickness of 0.3 pm is provided on a Si substrate 51 of which the main surface is (001) with a BOX layer 52 having a thickness of 3.0 μm in between.

Next, a resist is applied onto the i type Si layer 53 and patterned into the form of a Si passive waveguide through exposure to light using electron beam lithography, which is followed by development through wet etching. Next, a Si rib type waveguide 54 having a core layer 55 and a slab portion 56 is formed through ICP dry etching. Here, a tapered portion 57 is provided on the side that makes contact with the i type Si layer 53.

Figure 12A:
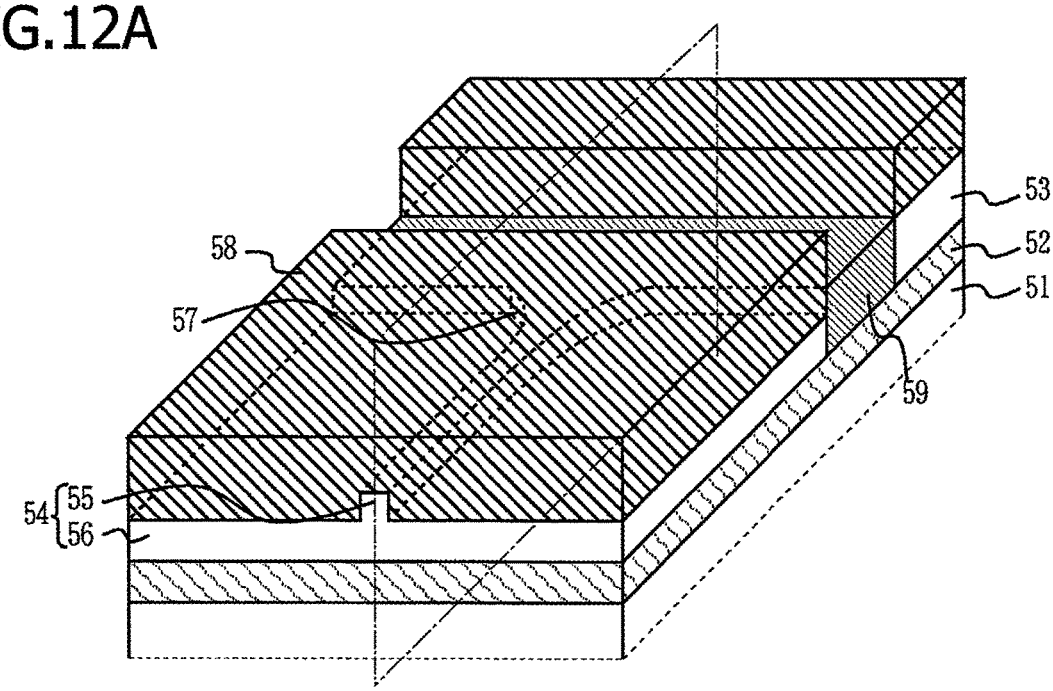
FIGS. 12A and 12B are diagrams illustrating the semiconductor light-receiving element according to Example 2 of the present invention in a step following the step in FIGS. 11A and 11B during the manufacturing process.
Figure 12B:
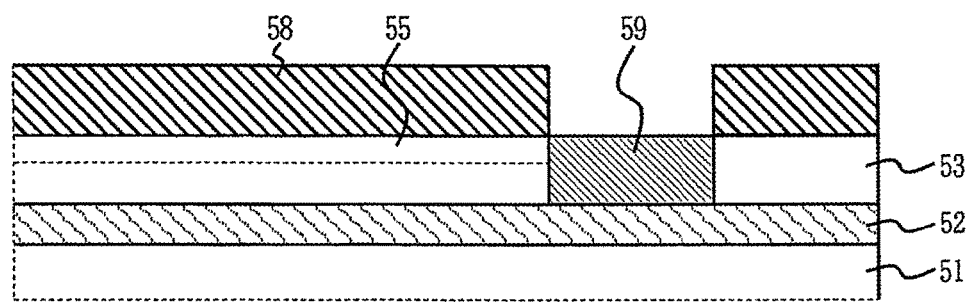

Next, as illustrated in FIGS. 12A and 12B a $SiO_2$ film is deposited on the entire surface in accordance with a CVD method and is patterned to form a mask 58 for ion implantation, which has openings only for regions of a light-receiving portion and a thyristor portion. Next, P ions are implanted using the mask 58 for ion implantation as a mask. In this case, the implantation energy is 150 keV and the dosage amount is $5.0 \times 10^{14}$ $cm^{-2}$. Next, an annealing process for activating the implanted B ions is carried out for one second at 1050° C. so as to form an n type Si layer 59. The concentration of impurities in the n type Si layer 59 is $1.0 \times 10^{18}$ $cm^{-3}$ to $3.0 \times 10^{19}$ $cm^{-3}$.

Figure 13A:
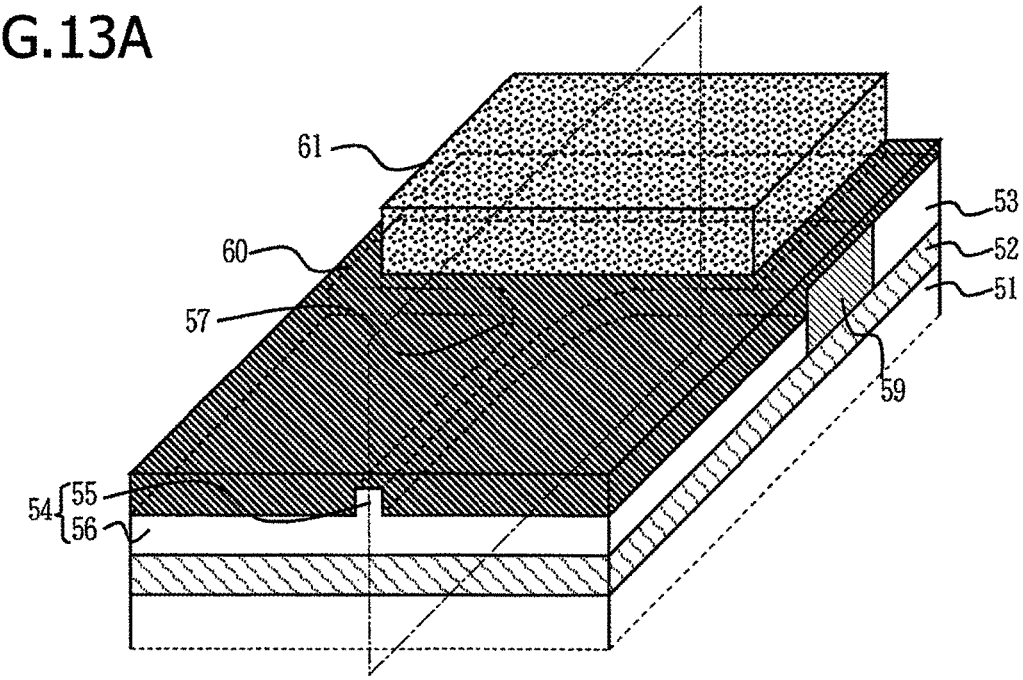
FIGS. 13A and 13B are diagrams illustrating the semiconductor light-receiving element according to Example 2 of the present invention in a step following the step in FIGS. 12A and 12B during the manufacturing process.
Figure 13B:
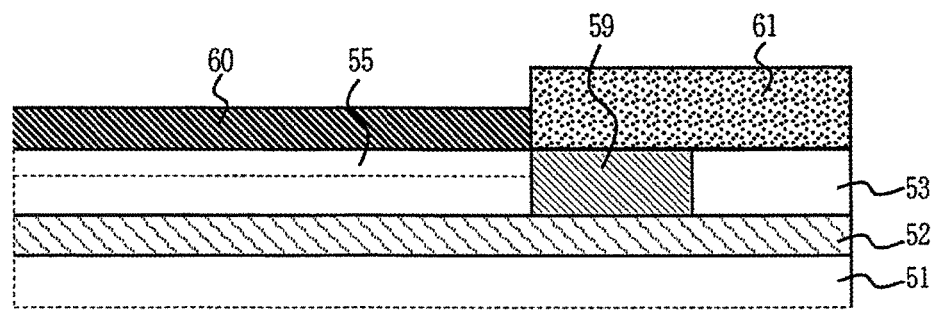

Next, as illustrated in FIGS. 13A and 13B, a mask 60 for selective growth made of a $SiO_2$ film is provided and an i type Ge layer 61, having a thickness of 0.8 μm is selectively grown in accordance with a low pressure CVD method. In this case, $GeH_4$ is used as a material gas and $H_2$ is used as a carrier gas. The layer is first grown by 0.1 μm at a low temperature of 600° C. and then the layer is grown by 0.7 μm at a high temperature of 700° C.

Figure 14A:
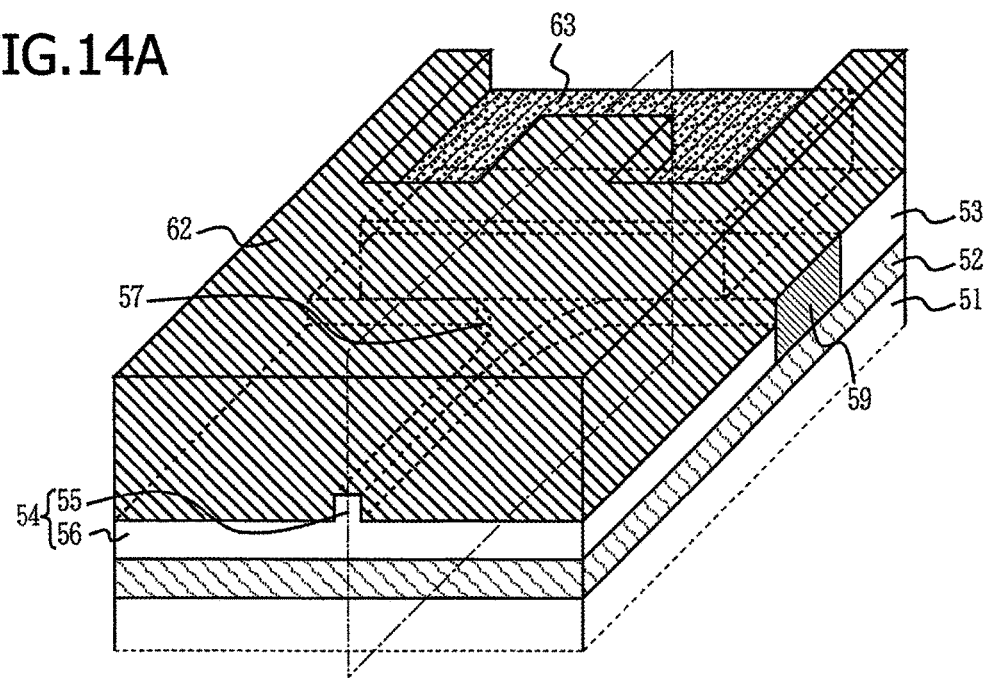
FIGS. 14A and 14B are diagrams illustrating the semiconductor light-receiving element according to Example 2 of the present invention in a step following the step in FIGS. 13A and 13B during the manufacturing process.
Figure 14B:
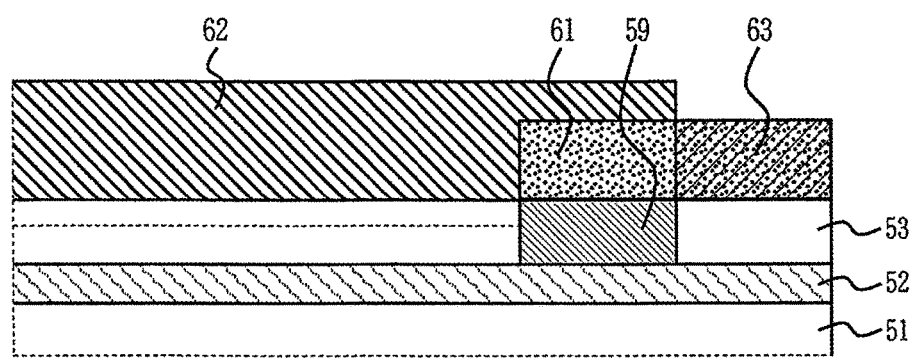

Next, as illustrated in FIGS. 14A and 14B, a mask 62 for ion implantation having an opening only for a portion in which a thyristor structure is to be formed is made of a $SiO_2$ film. Next, this mask 62 for ion implantation is used as a mask to implant B ions so that the entirety of the i type Ge layer 61 is doped. In this case, the implantation energy is 200 keV and the dosage amount is $3.0 \times 10^{14}$ $cm^{-2}$. As a result, the concentration of impurities in the p type Ge layer 63 is $2.0 \times 10^{18}$ $cm^{-3}$ to $6.0 \times 10^{18}$ $cm^{-3}$.

Figure 15A:
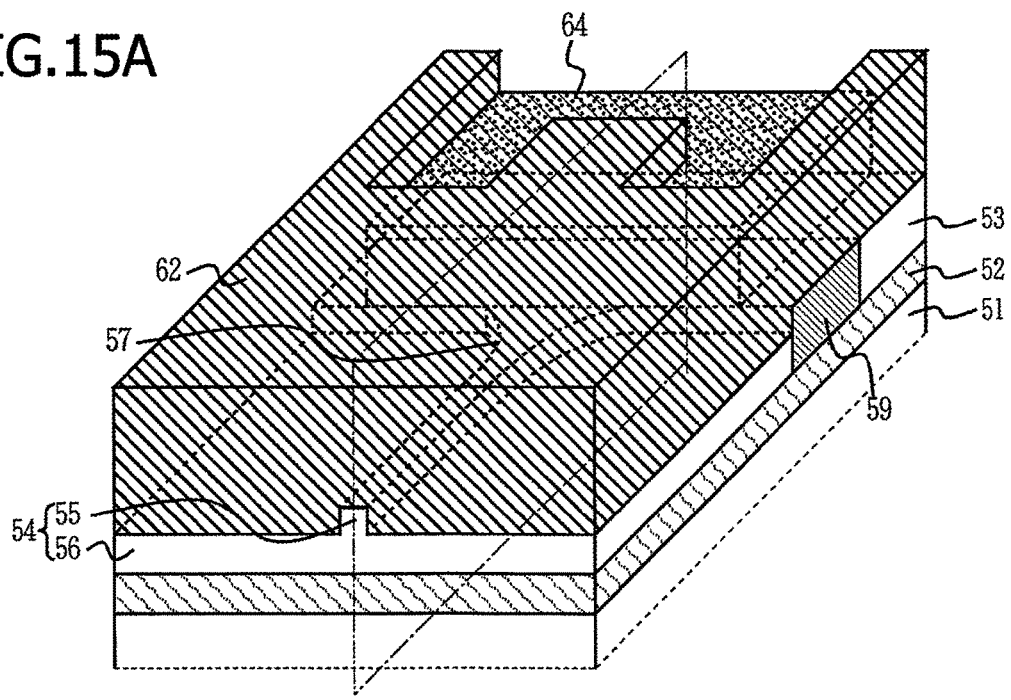
FIGS. 15A and 15B are diagrams illustrating the semiconductor light-receiving element according to Example 2 of the present invention in a step following the step in FIGS. 14A and 14B during the manufacturing process.
Figure 15B:
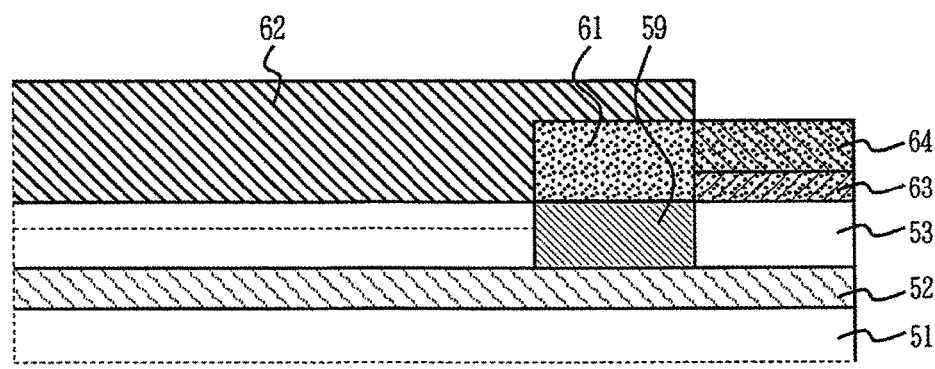

Next, as illustrated in FIGS. 15A and 15B, the same mask 62 for ion implantation is used as a mask to shallowly implant P ions so that the upper layer, having a thickness of 0.5 μm, is compensated and becomes an n type Ge layer 64 while the bottom layer, having a thickness of 0.3 μm, is not compensated and remains as a p type Ge layer 63. In this case, the implantation energy is 350 keV and the dosage amount is $8.0 \times 10^{14}$ $cm^{-2}$. As a result, the concentration of impurities in the n type Ge layer 64 is $1.0 \times 10^{18}$ $cm^{-3}$ to $3.0 \times 10^{19}$ $cm^{-3}$.

Figure 16A:
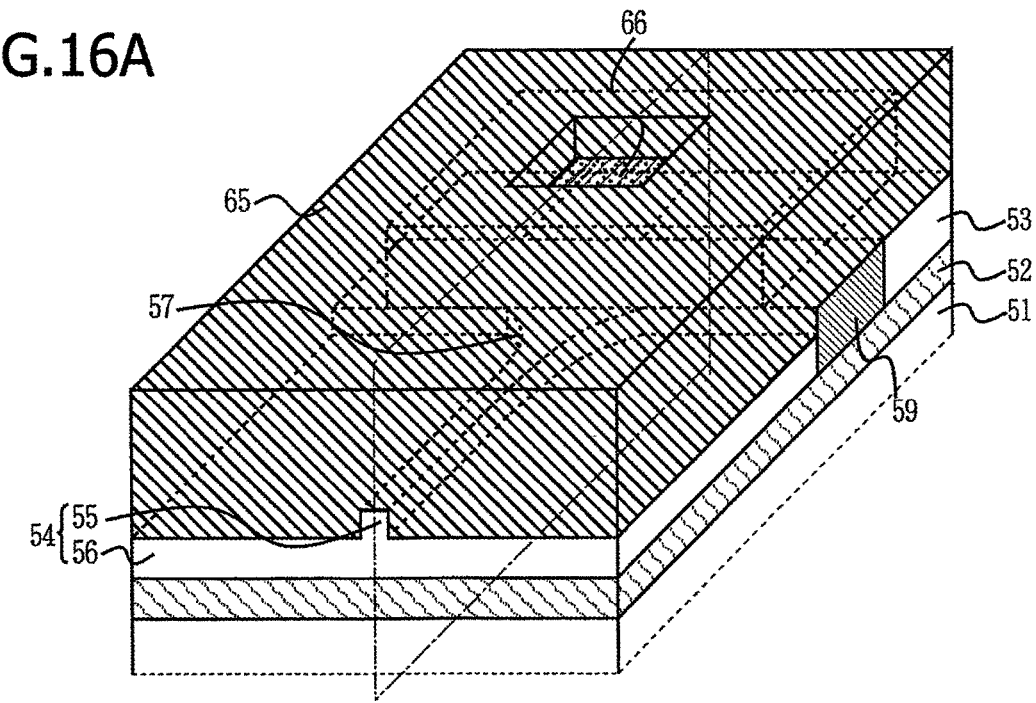
FIGS. 16A and 16B are diagrams illustrating the semiconductor light-receiving element according to Example 2 of the present invention in a step following the step in FIGS. 15A and 15B during the manufacturing process.
Figure 16B:
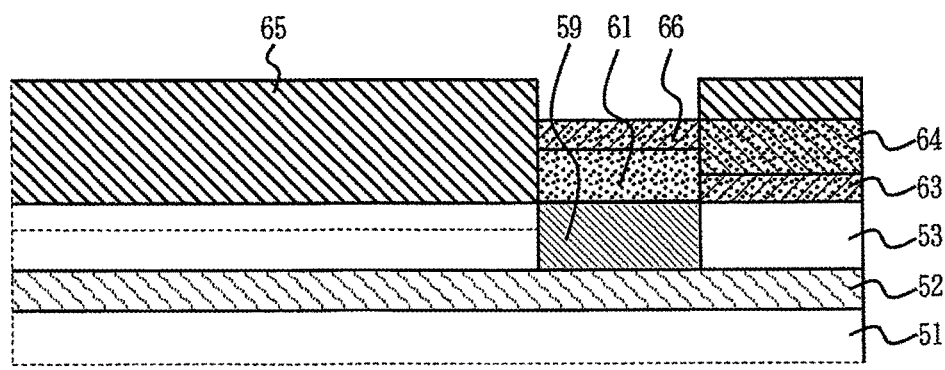

Next, as illustrated in FIGS. 16A and 16B, the mask 62 for ion implantation is removed with hydrofluoric acid, and after that a new mask 65 for ion implantation having an opening only for the region in which a photodiode is to be formed is made of a $SiO_2$ film. The mask 65 for ion implantation is used as a mask to implant B ions so that the upper layer, having a thickness of 0.3 μm, is converted to a p type Ge layer 66. In this case, the implantation energy is 20 keV and the dosage amount is $2.0 \times 10^{14}$ $cm^{-2}$. As a result, the concentration of impurities in the p type Ge layer 66 is $5.0 \times 10^{18}$ $cm^{-3}$ to $2.0 \times 10^{19}$ $cm^{-3}$, and the concentration of impurities located at a depth of 0.3 μm from the surface is $1.0 \times 10^{16}$ $cm^{-3}$.

Figure 17A:
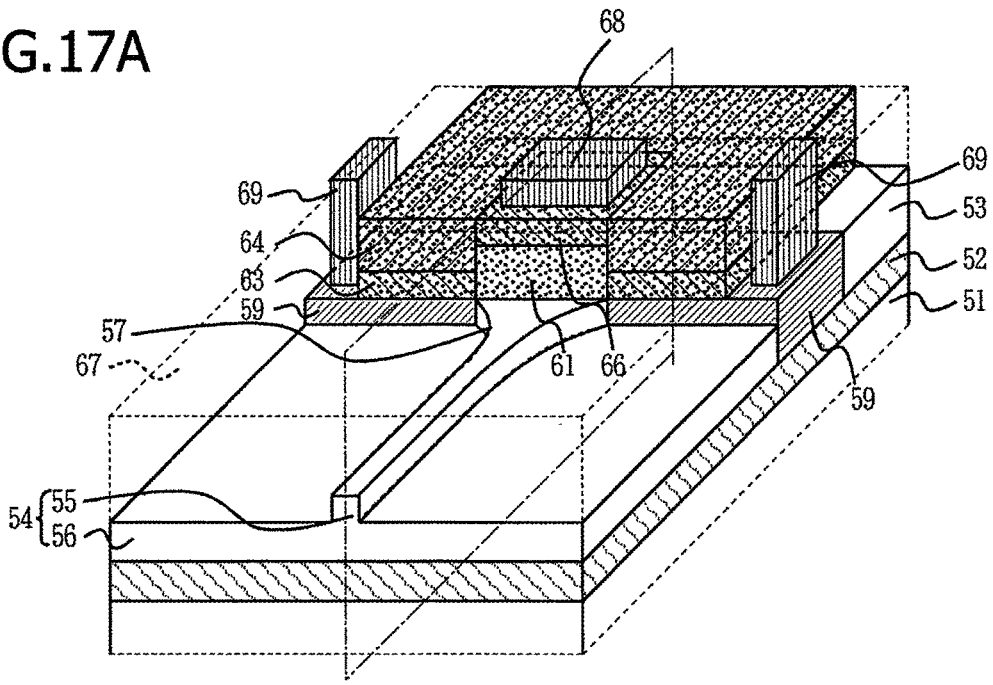
FIGS. 17A and 17B are diagrams illustrating the semiconductor light-receiving element according to Example 2 of the present invention in a step following the step in FIGS. 16A and 16B during the manufacturing process.
Figure 17B:
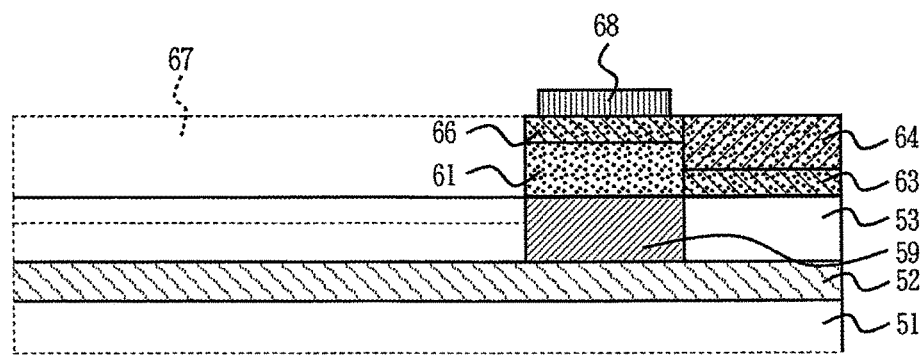

Next, as illustrated in FIGS. 17A and 17B, the mask 65 for ion implantation is removed with hydrofluoric acid, and after that annealing for activation is carried out for one second at 1050° C. so as to activate the implanted impurities. Next, a $SiO_2$ film, which becomes an upper clad layer 67 and also becomes a passivation film in the element portion, is deposited in accordance with a low pressure CVD method, and after that the surface of the $SiO_2$ film and the Ge layer is flattened in accordance with a chemical mechanical polishing (CMP) method.

Next, while not shown in the figures, a resist is applied onto the flattened surface and is patterned to the form of contact holes through exposure to light using electron beam lithography, which is followed by development through wet etching. Next, contact holes are created through ICP dry etching and wet etching with HF.

Next, a TiN film, which becomes a barrier metal, is formed in accordance with a spattering method, and after that the contact holes are filled in with Al. Next, the resist used for the creation of contact holes is removed and at the same time the Al layer that has been deposited on the resist is lifted off so as to form a p side electrode 68 and an n side electrode 69. Thus, the basic structure of the semiconductor light-receiving element according to Example 2 of the present invention is complete.

Figure 18A:
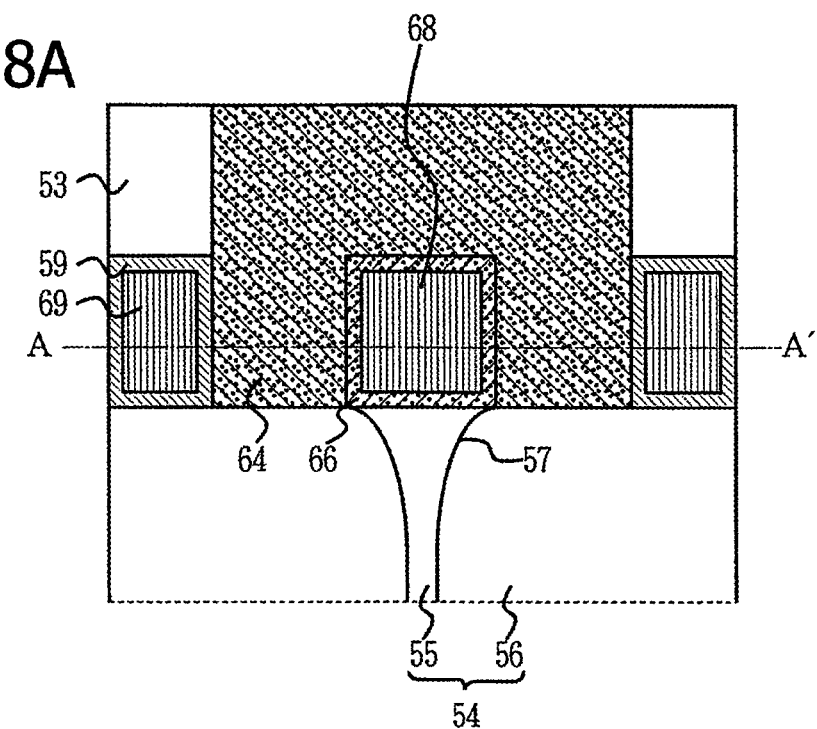
FIGS. 18A and 18B are diagrams illustrating the structure of the semiconductor light-receiving element according to Example 2 of the present invention.
Figure 18B:
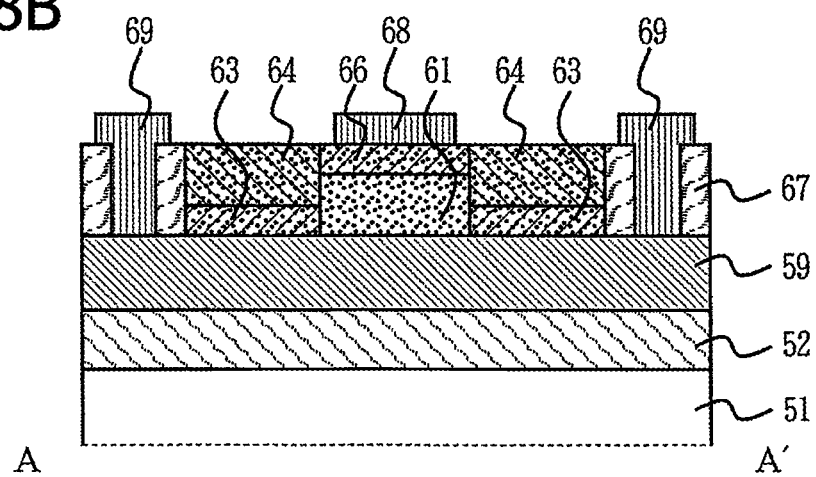

FIGS. 18A and 18B are diagrams illustrating the structure of the semiconductor light-receiving element according to Example 2 of the present invention. FIG. 18A is a top diagram and FIG. 18B is a cross-sectional diagram along the single-dotted chain line A-A' in FIG. 18A. As illustrated in the figures, the three sides of the PIN type photodiode made of the p type Ge layer 66, the i type Ge layer 61 and the n type Si layer 59 are surrounded by the n type Ge layer 64 and the p type Ge layer 63, and therefore strain relaxation on the three end surfaces can be prevented from affecting the PIN type photodiode. In addition, a thyristor structure made of the p type Ge layer 66, the n type Ge layer 64, the p type Ge layer 63 and the n type Si layer 59 is formed on the two sides of the PIN type photodiode so as to function as a current blocking layer, which makes it possible to reduce a leak current. Here, a pseudo thyristor-like current block mechanism is formed of the p type Ge layer 66, the n type Ge layer 64, the p type Ge layer 63, the i type Si layer 53 and the n type Si layer 59 on the side opposite to the surface through which light enters.

Signal light that has entered into the core layer 55 propagates through the tapered portion 57 and reaches the n type Si layer 59 so as to be transmitted to the i type Ge layer 61 through evanescent coupling, and then is extracted from the p side electrode 68 as an electrical signal. Here, the n side electrode 69 is usually set to the ground potential.

Example 3

Figure 19A:
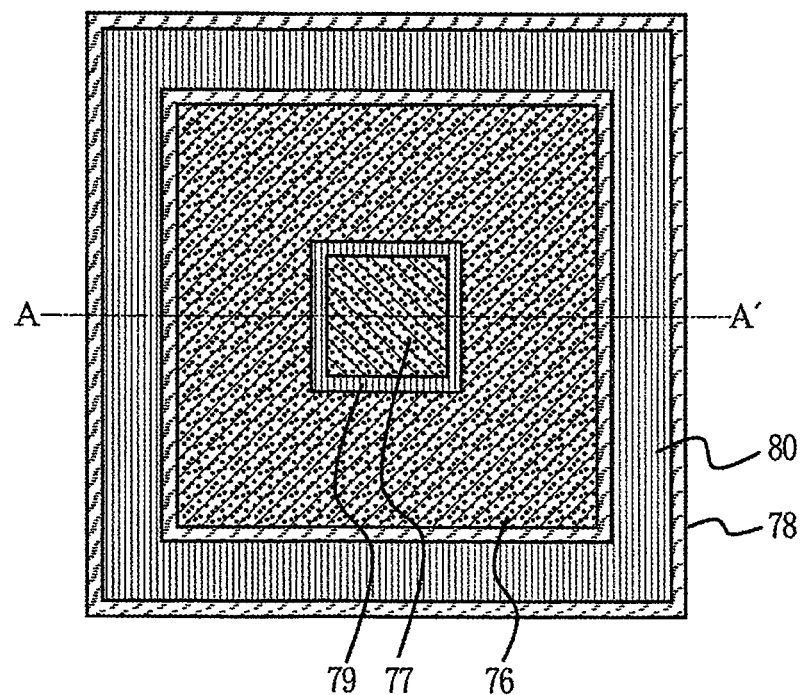
FIGS. 19A and 19B are diagrams illustrating the structure of the semiconductor light-receiving element according to Example 3 of the present invention.
Figure 19B:
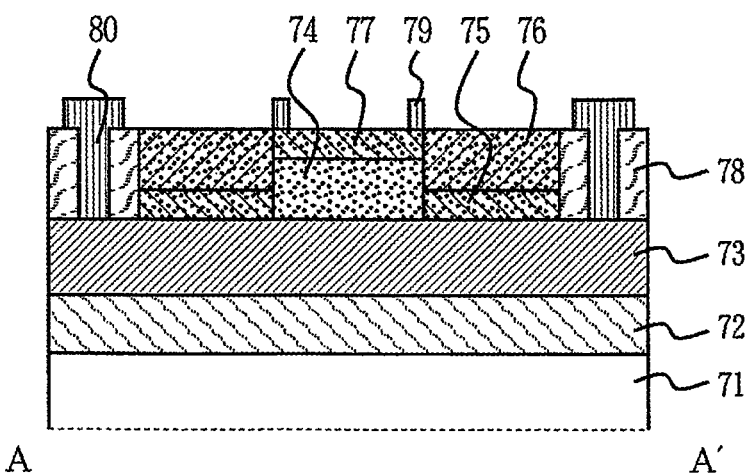
Figure 20:
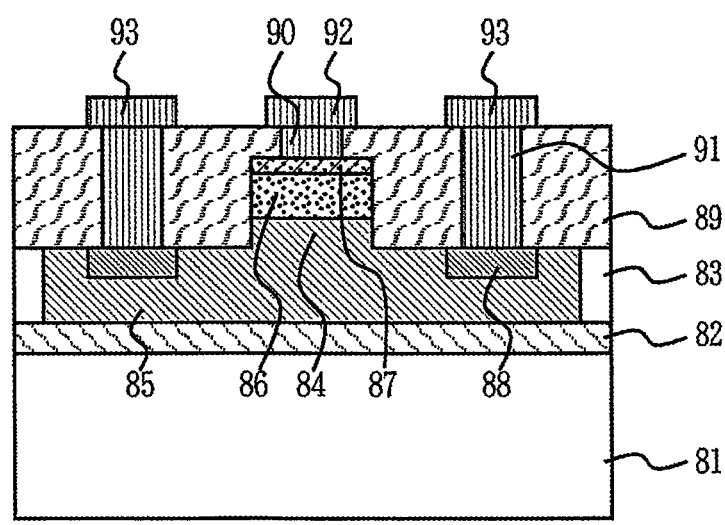
FIG. 20 is a schematic cross sectional diagram illustrating a conventional photodetector having Ge as a light absorbing layer.

Next, the semiconductor light-receiving element according to Example 3 of the present invention is described in reference to FIGS. 19A and 19B. The basic manufacturing process is the same as in the above description for Example 1 except that the semiconductor light-receiving element is a simple light-receiving element without the provision of a Si rib type waveguide, and therefore only the final structure is illustrated. Here, FIG. 19A is a top diagram and FIG. 19B is a cross-sectional diagram along the single-dotted chain line A-A' in FIG. 19A.

An SOI substrate is prepared where a single crystal i type Si layer having a thickness of 0.3 μm is provided on a Si substrate 71 of which the main surface is (001) with a BOX layer 72 having a thickness of 3.0 μm in between. Next, a mask for ion implantation having openings only for the regions in which a light-receiving portion and a thyristor portion are to be formed is made on the i type Si layer, and this mask for ion implantation is used as a mask to implant B ions. In this case, the implantation energy is 40 keV and the dosage amount is $5.0 \times 10^{14}$ $cm^{-2}$. Next, an annealing process for activating the implanted B ions is carried out for one second at 1050° C. so as to form a p type Si layer 73. The concentration of impurities in the p type Si layer 73 is $1.0 \times 10^{18}$ $cm^{-3}$ to $3.0 \times 10^{19}$ $cm^{-3}$.

Next, a mask for selective growth made of a $SiO_2$ film is provided, and an i type Ge layer 74 having a thickness of 0.8 μm is selectively grown on the p type Si layer 73 in accordance with a low pressure CVD method. In this case, $GeH_4$ is used as a material gas and $H_2$ is used as a carrier gas. First, the layer is grown by 0.1 μm at a low temperature of 400° C., and then the layer is grown by 0.7 μm at a high temperature of 700° C.

Next, a mask for ion implantation having an opening only for a portion in which a thyristor structure is to be formed is made of a $SiO_2$ film, and this mask for ion implantation is used as a mask to implant P ions so that the entirety of the i type Ge layer 74 is doped. In this case, the implantation energy is 600 keV and the dosage amount is $1.0 \times 10^{14}$ cm$^{-2}$. As a result, the concentration of impurities in the n type Ge layer 75 is $1.0 \times 10^{18}$ cm$^{-3}$ to $2.0 \times 10^{18}$ cm$^{-3}$.

Next, the same mask for ion implantation is used as a mask to shallowly implant B ions so that the upper layer, having a thickness of 0.5 μm, is compensated and becomes a p type Ge layer 76 while the bottom layer, having a thickness of 0.3 μm, is not compensated and remains as an n type Ge layer 75. In this case, the implantation energy is 100 keV and the dosage amount is $3.0 \times 10^{14}$ cm$^{-2}$. As a result, the concentration of impurities in the p type Ge layer 76 is $1.0 \times 10^{18}$ cm$^{-3}$ to $1.0 \times 10^{19}$ cm$^{-3}$.

Next, the mask for ion implantation is removed with hydrofluoric acid, and after that a new mask for ion implantation having an opening only for the region in which a photodiode is to be formed is made of a $SiO_2$ film. This mask for ion implantation is used as a mask to implant P ions so that the upper layer, having a thickness of 0.3 μm, is converted to an n type Ge layer 77. In this case, the implantation energy is 40 keV and the dosage amount is $1.0 \times 10^{14}$ cm$^{-2}$. As a result, the concentration of impurities in the n type Ge layer 77 is $4.0 \times 10^{18}$ cm$^{-3}$ to $1.0 \times 10^{19}$ cm$^{-3}$, and the concentration of impurities located at a depth of 0.3 μm from the surface is $1.0 \times 10^{16}$ cm$^{-3}$.

Next, the mask for ion implantation is removed with hydrofluoric acid, and after that annealing for activation is carried out for one second at 1050° C. so as to activate the implanted impurities. Next, a $SiO_2$ film, which becomes a passivation film 78 is deposited, and after that the surface of the $SiO_2$ film and the Ge layer is flattened in accordance with a CMP method.

Next, a resist is applied onto the flattened surface and is patterned to the form of contact holes through exposure to light using electron beam lithography, which is followed by development through wet etching. Next, contact holes are created through ICP dry etching and wet etching with HF.

Next, a TiN film, which becomes a barrier metal, is formed in accordance with a spattering method, and after that the contact holes are filled in with Al. Next, the resist used for the creation of contact holes is removed and at the same time the Al layer that has been deposited on the resist is lifted off so as to form an annular n side electrode 79 and a p side electrode 80. Thus, the basic structure of the semiconductor light-receiving element according to Example 3 of the present invention is complete.

As described above, in Example 3 of the present invention, all sides of the PIN type photodiode are surrounded by the p type Ge layer 76 and the n type Ge layer 75, and therefore strain relaxation in the end portion can be completely prevented from affecting the PIN type photodiode. In addition, a thyristor structure made of the n type Ge layer 77, the p type Ge layer 76, the n type Ge layer 75 and the p type Si layer 73 is formed so as to completely surround the PIN type photodiode and functions as a current blocking layer, which makes it possible to reduce the leak current.

In the semiconductor light-receiving element in Example 3 as illustrated in the figure, light enters from above, transmits through the n type Ge layer 77, is absorbed by the i type Ge layer 74 and is extracted from the n side electrode 79 as an electrical signal. In this case, the p side electrode 80 is set to the ground potential.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method for manufacturing a semiconductor light-receiving element comprising:
   implanting impurity ions of a first conductivity type into at least a portion of a surface of a substrate of which the surface is a single crystal Si layer and annealing the impurity ions for activation;
   growing a non-doped Ge layer on at least a Si region of the first conductivity type into which impurity ions of the first conductivity type have been implanted;
   forming, on a surface of the non-doped Ge layer, a first dielectric mask that covers a region on which a photodiode is to be formed;
   implanting impurity ions of a second conductivity type that is the opposite conductivity type of the first conductivity type into an exposed portion of the non-doped Ge layer using the first dialectic mask as a mask;
   compensating the surface with impurities of the first conductivity type by implanting the impurities of the first conductivity type into the exposed portion of the non-doped Ge layer at a location that is shallower than the impurities of the second conductivity type using the first dielectric mask as a mask;
   forming a second dielectric mask from which only the region on which a photodiode is to be formed is exposed;
   implanting impurities of the second conductivity type into an exposed surface of the non-doped Ge layer using the second dielectric mask as a mask; and
   annealing the implanted impurities for activation.

2. The method for manufacturing a semiconductor light-receiving element according to claim 1, further comprising etching of the single crystal Si layer in order to form a tapered waveguide portion to be connected to the photodiode region and form a core layer in stripe form to be connected to the tapered waveguide portion.

3. The method for manufacturing a semiconductor light-receiving element according to claim 1,
   wherein the growth of a non-doped Ge layer is a two-stage growth including a first growth stage of growing the layer at a relatively low temperature and a second growth stage of growing the layer at a temperature relatively high as compared to that of the first growth stage.

4. The method for manufacturing a semiconductor light-receiving element according to claim 1, wherein the method for growing a non-doped Ge layer is either a low pressure chemical vapor deposition method or a molecular beam epitaxial growth method.

* * * * *